(12) United States Patent
Boettcher et al.

(10) Patent No.: US 11,300,591 B2
(45) Date of Patent: Apr. 12, 2022

(54) CONTACTLESS CURRENT MEASUREMENT

(71) Applicant: Vacuumschmelze GmbH & Co. KG, Hanau (DE)

(72) Inventors: Steffen Boettcher, Kahl (DE); Holger Schwenk, Hanau (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 2 days.

(21) Appl. No.: 16/216,989

(22) Filed: Dec. 11, 2018

(65) Prior Publication Data

US 2019/0178916 A1 Jun. 13, 2019

(30) Foreign Application Priority Data

Dec. 13, 2017 (DE) ...................... 10 2017 222 667.6

(51) Int. Cl.
*G01R 15/18* (2006.01)

(52) U.S. Cl.
CPC ................. *G01R 15/183* (2013.01)

(58) Field of Classification Search
CPC .... G01R 15/18; G01R 15/181; G01R 15/183; G01R 15/146; G01R 15/185; G01R 15/186; G01R 15/20
See application file for complete search history.

(56) References Cited

U.S. PATENT DOCUMENTS

| | | |
|---|---|---|
| 2009/0230776 A1 | 9/2009 | Ochi et al. |
| 2009/0315536 A1* | 12/2009 | Koch ............... G01R 19/20 324/117 R |
| 2016/0033555 A1 | 2/2016 | Boettcher et al. |
| 2017/0176567 A1* | 6/2017 | Neti ............... G01R 15/18 |

FOREIGN PATENT DOCUMENTS

| | | |
|---|---|---|
| DE | 112009000632 T5 | 4/2011 |
| DE | 102014215109 A1 | 2/2016 |

OTHER PUBLICATIONS

German Search Report regarding DE 10 2017 222 667.6 dated Aug. 7, 2018.

* cited by examiner

*Primary Examiner* — Son T Le
(74) *Attorney, Agent, or Firm* — Dickinson Wright PLLC

(57) ABSTRACT

For contactless current measurement at a first primary conductor that is configured to conduct a first primary current having a first current strength, and at a second primary conductor that is configured to conduct a second primary current having a second current strength, a ring-shaped magnetic core that encircles the first primary conductor and the second primary conductor detects the total magnetic field in the magnetic core and generates from the total magnetic field detected in the magnetic core a signal corresponding to the superposition of the first current strength and the second current strength. The first or second magnetic field component or individually both are also detected, and from the detected first or second magnetic field component or from both, a signal corresponding to the first current strength or a signal corresponding to the second current strength or both are generated.

21 Claims, 6 Drawing Sheets

CONTACTLESS CURRENT MEASUREMENT

CROSS-REFERENCE TO RELATED APPLICATIONS

This U.S. utility application claims the priority of German patent application no. 10 2017222667.6 filed on Dec. 13, 2017, the entirety of which is herein incorporated by reference.

BACKGROUND

1. Technical Field

The present invention relates to arrangements and methods for contactless current measurement, in particular arrangements and methods in accordance with the Flux-Gate Principle.

2. Related Art

For the contactless, and hence potential-free, measurement of an electrical current strength in a conductor, so-called Open Loop Current Sensors are frequently used. These detect the current-induced magnetic flux using, for example, a Hall-sensor in combination with a magnetic core that entirely or partially encircles the conductor and then generate a signal in proportion to the current strength by means of a subsequent signal processing that does not have a (closed) control loop structure. These sensors are economical but have been shown to be somewhat lacking in accuracy.

In addition, so-called Compensation Current Sensors are also used. These are employed, for example, to continuously generate an opposing magnetic field of the same strength as the magnetic field produced by the current to be measured in order to achieve a complete and constant compensation of the magnetic field. Based on the parameters of the opposing field generation, the amperage of the measured current can be derived. Compensation current sensors are more complex, but for that more accurate.

One particular group of compensation current sensors, however, does not include any closed control loops. These so-called Flux Gate Current Sensors only compensate the magnetic field produced by the current to be measured during specific time intervals within a measurement cycle. In addition to this, during every measurement cycle the core becomes magnetically saturated, both in positive and negative magnetic field directions, by the effects of the compensation coil. With appropriate subsequent signal processing, the hysteresis effect of the core can be eliminated and a highly accurate current strength measurement can be obtained. Because of this, flux gate current sensors are also suitable for differential current measurement. Differential current measurement is a special case of summation current measurement. During summation current measurement, at least two conductors are encircled by the core and the total current of all of these conductors is detected. If, in the summation current measurement, the currents are flowing in mutually opposing directions in at least two conductors, then this is referred to as a differential current measurement, whereby the difference between currents of approximately the same strength flowing in opposing directions may be very small.

Current sensors capable of differential current measurement are often employed in fault current circuit breakers. In accordance with VDE norm 0100-530, in household, fault current circuit breakers of the type A are usually used. These are designed to detect faults in both alternating currents, as well as in pulsating direct currents. In case of consumers generate a direct current that is larger than 6 mA in the electrical grid, the magnetic core in the circuit breaker will become saturated and will no longer be capable of satisfactorily detecting faults—or it will become incapable of detecting them at all. This creates considerable danger for people and it could present a fire hazard. In today's applications (for example, in charging cables for electric vehicles, solar power inverters without transformers, etc.), this direct current superposition in the electrical grid can occur. For such cases, fault current circuit breakers of the type B may also be installed. These can disconnect the grid when a specific mixed current value is reached. To be on the safe side, numerous additional measures can be taken for protection in devices in which the risk of a direct current superposition is present. Care must always be taken, however, to ensure that no flow of direct current stronger than a specified maximum value (for example, 6 mA) enters the grid, in order that the core of the fault current circuit breaker does not become saturated.

SUMMARY

This is accomplished with a current sensor arrangement and a method for contactless current measurement as described in the following.

The current sensor arrangement comprises a first primary conductor, configured to conduct a first primary current having a first current strength, and a second primary conductor, configured to conduct a second primary current having a second current strength, as well as a toroidal (ring-shaped) magnetic core that encircles the first primary conductor and the second primary conductor such that the first primary current generates a first magnetic field component and the second primary current generates a second magnetic field component in the magnetic core, wherein the first magnetic field component and the second magnetic field component superpose to a total magnetic field. The current sensor arrangement further comprises a magnetic field evaluation device that is configured to detect the total magnetic field in the magnetic core and to generate from this a signal corresponding to the sum of the first current strength and the second current strength and that is further configured to individually detect the first magnetic field component, or the second magnetic field component, or both components, and to generate from this a signal corresponding to the first current strength, or a signal corresponding to the second current strength, or both of these signals.

The method for contactless current measurement at a first primary conductor that is configured to conduct a first primary current having a first current strength and at a second primary conductor that is configured to conduct a second primary current having a second current strength by means of a toroidal core that encircles the first primary conductor and the second primary conductor such that the first primary current generates a first magnetic field component and the second primary current generates a second magnet field component, and the first magnetic field component and the second magnetic field component superpose to a total magnetic field, comprises detecting the total magnetic field in the magnetic core and generating, from the total magnetic field detected in the magnetic core, a signal corresponding to the sum of the first current strength and that of the second current strength. The method also comprises detecting individually the first magnetic field component or the second magnetic field component or both and generating, from the detected first magnetic field component or the second magnetic field component or both, a signal corresponding to the first current strength or a signal corresponding to the second current strength or both of these signals.

BRIEF DESCRIPTION OF THE FIGURES

The invention is described in greater detail with reference to the embodiments illustrated in the figures, wherein similar or identical elements are designated with the same reference signs.

DETAILED DESCRIPTION

Figure 1:
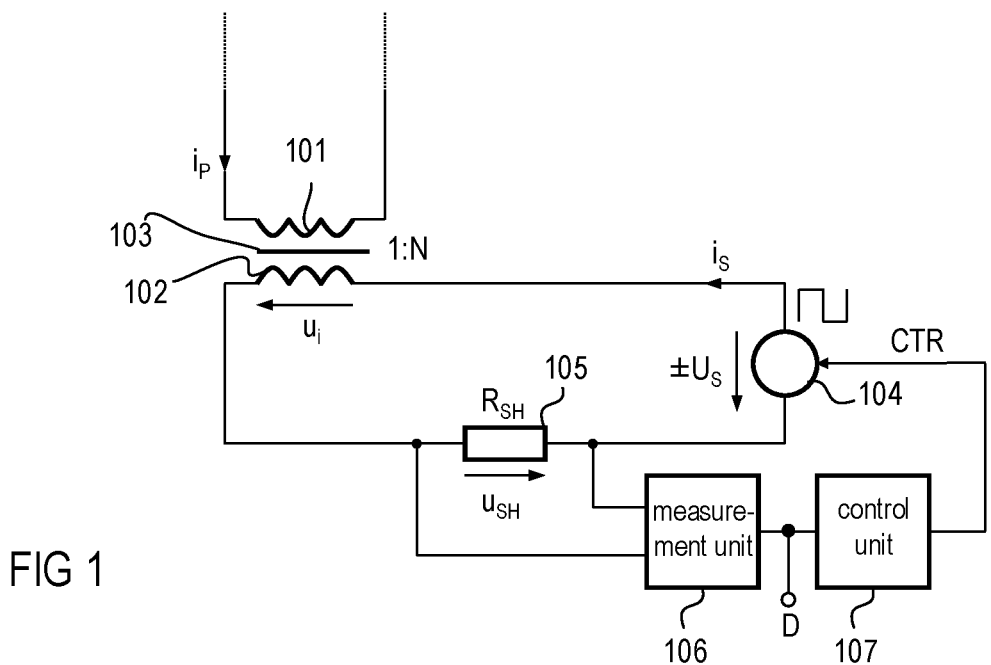
FIG. 1 shows, in a block diagram, a current sensor that operates according to the Flux Gate Principle.

In FIG. 1, an exemplary current sensor is shown which operates in accordance with the Flux Gate Principle and which exhibits no hysteresis errors. In the example shown, the current sensor is to measure a current which, in the following, will be designated as primary current $i_P$ and which flows through a primary conductor 101. The current sensor comprises a secondary conductor 102, as well as, for example, a toroidal (magnetic) core 103 with no gap and made of soft magnetic material. The primary conductor 101 and the secondary conductor 102 are magnetically coupled to each other via the core 103 and may each be unwound (number of coils equals 1) or wound (number of coils is greater than 1), wherein the number of windings of the primary conductor 101 and of the secondary conductor 102 can be different or identical. For example, the primary conductor may extend straight through the toroidal core 103, meaning unwound and encircled by the toroidal core 103. The secondary conductor 102 can be wound with a given number of windings N (N>1), meaning it is wound with more than one coil around the core 103.

The secondary conductor 102 is fed by a controlled voltage source 104 which generates, for example, a rectangular bipolar source voltage $\pm U_S$, thus driving a secondary current $i_S$ through the secondary conductor 102. In order to measure the secondary current $i_S$, a shunt resistor 105 having a resistance value of $R_{SH}$ is connected between secondary conductor 102 and voltage source 104. A voltage $U_{SH}$ present at the shunt resistor 105 is tapped, by measurement unit 106, evaluated, and fed to a control unit 107 in the form of a signal D representing the differential current. The control unit 107 generates from this a control signal CTR, with which the voltage source 104 is controlled.

Figure 2:
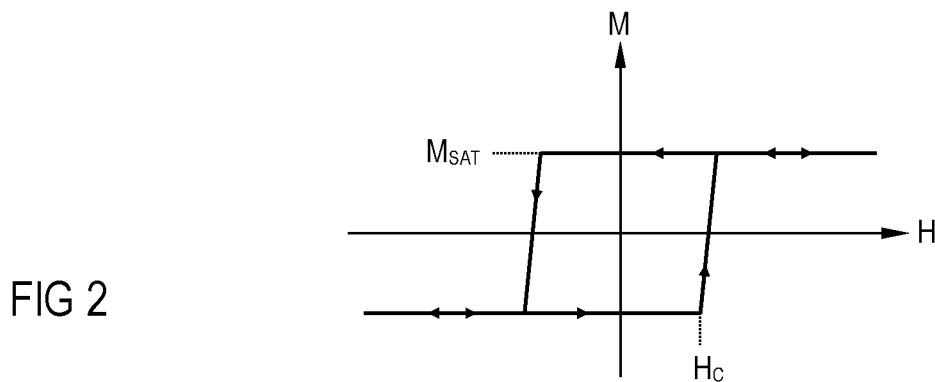
FIG. 2 shows, in a diagram as magnetization over magnetic field strength, the idealized path of the magnetization characteristic curve of the magnetic core with a freely oscillating current sensor and with a primary current of zero.

The functioning of the current sensor shown in FIG. 1 will now be explained in greater detail with reference to the FIGS. 2-5. The magnetization characteristic curve shown in FIG. 2 illustrates the ferromagnetic properties of the magnetic core 103 when a primary current is absent, wherein the magnetic field strength H is plotted along the abscissa and the magnetization M is plotted along the ordinate. The characteristic curve of the magnetization exhibits an almost rectangular hysteresis with a coercive field strength $H_C$ and a saturation magnetization $M_{SAT}$. In accordance with Ampere's Law, in simplified terms $H=i_S/l_{FE}\cdot N$, wherein the parameter $l_{FE}$ designates the effective magnetic path length of the magnetic field lines in the core 103 and N is the number of windings of the secondary conductor 102 when the number of windings of the primary conductor 101 equals 1.

In accordance with Faraday's Law, for a voltage $u_i$ induced in the secondary conductor 102 the following holds true:

$$u_i=-N\cdot d\Phi/dt=-N\cdot A\cdot dB/dt, \quad (1)$$

wherein A designates the (effective) cross-sectional surface of the core 103, $\Phi$ designates the magnetic flux caused by the secondary current $i_S$ in the core 103, B designates the magnetic flux density with $B=\mu_0\cdot(H+M)$ and $\mu_0$ to designates the magnetic field constant. During the reversal of the magnetization of the core 103, which corresponds to the left or right vertical branch of the magnetization characteristic curve in FIG. 2, the rate of change of the magnetization dM/dt is proportional to the induced voltage $u_i$, wherein the magnetic field strength H, and thus also the secondary current $i_S$, are constant, i.e.

$$u_i=-N\cdot A\cdot\mu_0\cdot dM/dt \text{(during reversal of magnetization)}, \quad (2)$$

or, in other words, the differential inductance of the secondary conductor 102 during the reversal of the magnetization becomes almost infinitively large. As soon as the magnetization in the core 103 has reached the saturation magnetization $M_{SAT}$, the secondary current $i_S$ begins to increase and is then only limited by the sum of the ohmic resistance value of the secondary conductor 102 and the ohmic resistance value $R_{SH}$ of the shunt resistor 105.

Figure 3:
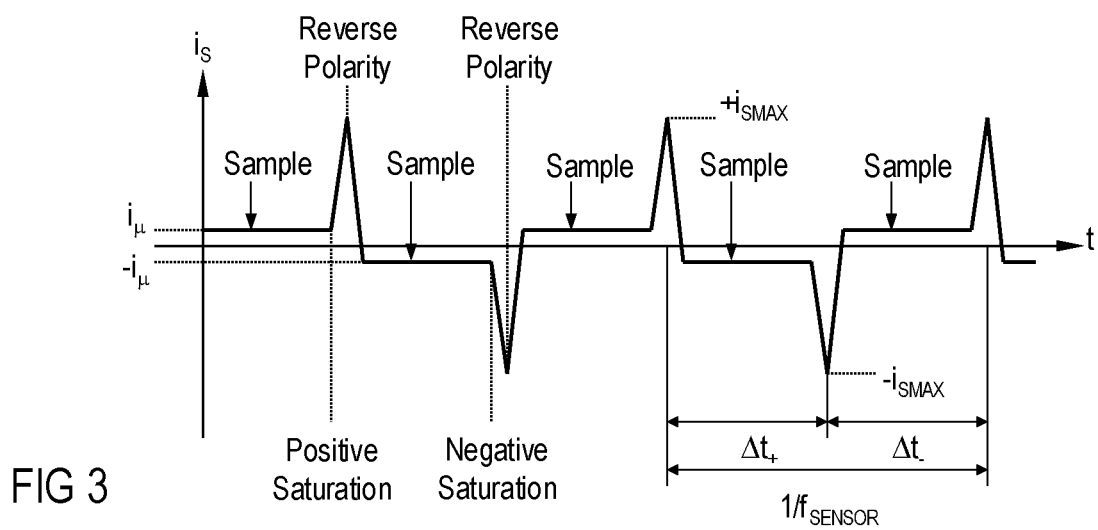
FIG. 3 shows, in a current-time diagram, the idealized path of the secondary current in a freely oscillating current sensor with a primary current of zero.

The waveform over time of the secondary current $i_S$, when the primary current $i_P$ equals zero, is illustrated in FIG. 3. An increase of the secondary current $i_S$ is detected by the control unit 107, wherein, for example, comparators may be employed. As soon as the secondary current $i_S$ exceeds a positive threshold value $+i_{SMAX}$ or falls below a negative threshold value $-i_{SMAX}$, the control unit 107 generates the control signal CTR in order to reverse the polarity of the voltage source 104 and thus initiate the next magnetization reversal cycle. In this case, the secondary current $i_S$ is constant and corresponds to a magnetization current+$i_\mu$ or, as the case may be −$i_\mu$. The value of the magnetization current $i_\mu$ depends on the width of the hysteresis in the magnetization characteristic curve, hence, on the coercive field strength $H_C$, i.e. $i_\mu=1_{FE}/N\cdot H_C$. As soon as the magnetization in the core 103 reaches the positive or negative saturation magnetization, the secondary current $i_S$ begins to increase, as described above. Due to the symmetry of the hysteresis characteristic curve, the waveform over time of the secondary current $i_S$ is symmetric around an mean value.

Figure 4:
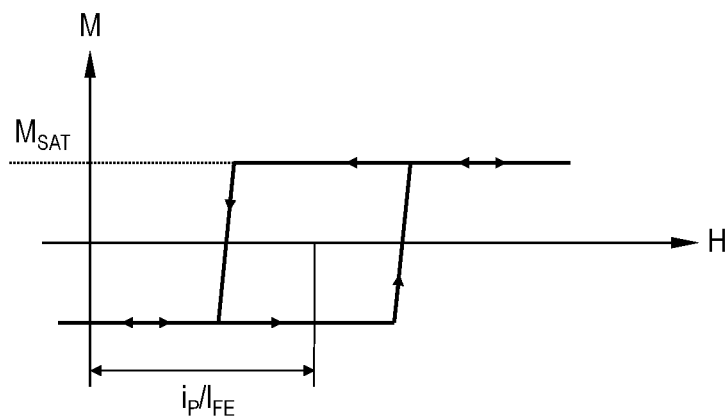
FIG. 4 shows, in a diagram as magnetization over magnetic field strength, the idealized path of the magnetization characteristic curve of the magnetic core in a freely oscillating current sensor with a primary current of greater than zero.
Figure 5:
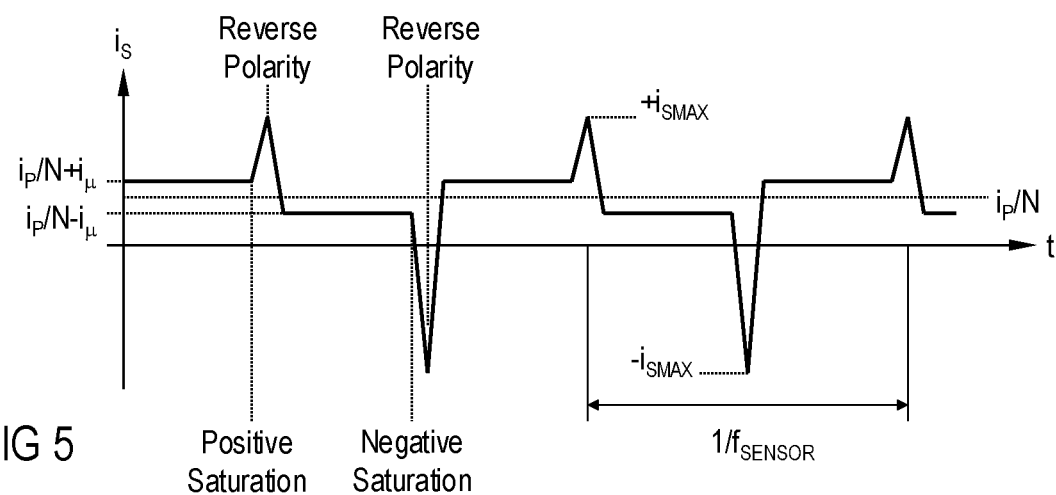
FIG. 5 shows, in a current-time diagram, the idealized path of the secondary current in a freely oscillating current sensor with a primary current of greater than zero.

FIGS. 4 and 5 show the magnetization characteristic curve and the waveform over time of the secondary current $i_S$ for the case in which the primary current $i_P$ does not equal zero. The magnetic field generated by the primary current $i_P$ is added, in the core 103, to the magnet field of the secondary current $i_S$, which is represented in FIG. 4 as a shift in the magnetization characteristic curve along the abscissa as compared to FIG. 2. The corresponding waveform over time of the secondary current $i_S$ is illustrated in FIG. 5. This waveform is similar to that of the case illustrated in FIG. 3, in which the primary current $i_P$ equals zero, albeit with the difference that the secondary current $i_S$ no longer runs symmetrically to the abscissa (is =0), but instead runs symmetrically to a line shifted parallel to the abscissa with is =$i_P$/N. This means that, during magnetization reversal, primary current $i_P$ and secondary current $i_S$ are in the same proportion k to each other as the number of windings of the primary conductor 101 and the secondary conductor 102, apart from a hysteresis offset at the level of the magnetization current ±$i_\mu$. In order to measure the current, the secondary current signal is or the voltage $u_{SH}$ at the shunt resistor 105 is sampled during the magnetization reversal. During the first half period of the secondary current $i_S$ (first measurement cycle), the sampling of the signal representing the secondary current $i_S$ by the measurement unit 106 produces a measured current value $i_S[n-1]=(i_P/N)+i_\mu$ and during the second half period (second measurement cycle) a measured current value of $i_S[n]=(i_P/N)-i_\mu$ is produced. By averaging over the first and second measurement cycles, the hysteresis error caused by the magnetization current can then be eliminated. The primary current $i_P$ at a sampling time point n can be calculated as follows:

$$i_P[n]=(N/2)\cdot(i_S[n-1]+i_S[n]). \qquad (3)$$

Because of the fact that the hysteresis of the magnetization characteristic curve has virtually no effect on the measurement results, this current measurement method is very good for measuring very small currents. The measurement range extends from a few milliampers up to kiloamperes. During the magnetization reversal of core 103, the secondary current $i_S$ follows the primary current $i_P$ according to the transformation ratio N:1. The secondary current $i_S$ is sampled at least once during the magnetization reversal in order to obtain a measured value for the calculation of the primary current $i_P$. However, during the magnetization reversal the sampling may be carried out repeatedly at a sampling rate that is substantially higher than an oscillation frequency of the sensor $f_{SENSOR}$. During the magnetization reversal and until the point at which the core 103 becomes magnetically saturated, the secondary current $i_S$ stays approximately constant and equal to $(i_P/N)\pm i_\mu$. This idealized approach can be applied when the hysteresis characteristic curve of the magnetic core 103 is approximately rectangular.

The measuring technique explained above with reference to the FIGS. 1 to 5 can also be employed, with only slight modifications of the sensor arrangement shown in FIG. 1, for differential current measurement. Differential current measurement is employed, for example, in error current circuit breakers. For this, the primary coil 101 is divided into a first partial coil 101a and into (at least) one second partial coil 101b. Accordingly, the primary current flowing through the first partial coil 101a is designated as $i_{Pa}$ and the primary current flowing through the second partial coil is designated as $i_{Pb}$. The partial coils 101a and 101b may each consist of only a single winding and can be oriented such that the magnetic fields produced by the primary currents $i_{Pa}$ and $i_{Pb}$ at least partially compensate each other (destructive interference) and only the net primary current $i_{Pa}-i_{Pb}$ (effective primary current) generates a corresponding net magnetic field in the core 103. The net magnetic field is then superposed by the magnet field of the secondary current $i_S$. An accordingly modified sensor is depicted in FIG. 6 and is, apart from the differing configuration of the primary coil 101, essentially identical to the sensor shown in FIG. 1.

Figure 6:
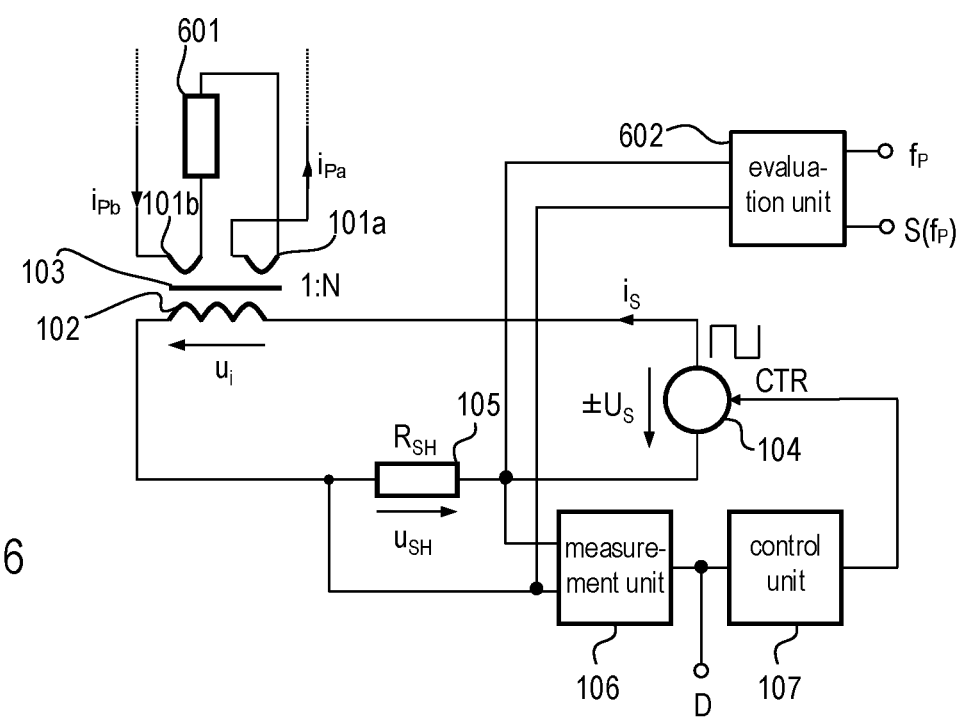
FIG. 6 shows in a block diagram, a current sensor that operates according to the Flux Gate Principle, in particular for differential current measurement and for detecting the strength of the primary current.

In the example shown in FIG. 6, the two partial coils 101a and 101b are connected upstream and downstream of a load 601, so that the difference, that is the net primary current $i_{Pa}-i_{Pb}$, will only then not be equal to zero if, for example, a leakage current is flowing off from the area of the load 601, which will then exactly correspond to the net primary current $\Delta i_P=i_{Pa}-i_{Pb}$. The net primary current is calculated from the sampling values of the secondary current, analogously to equation 3, as follows:

$$\Delta i_P[n]=i_{Pa}[n]-i_{Pb}[n]=N\cdot(i_S[n-1]+i_S[n])/2. \qquad (4)$$

The time intervals $\Delta t+$ and $\Delta t-$ (see FIG. 3) are not constant, but rather depend on the value of the primary current. Thus, the higher the rate of the magnetization reversal as according to equation 2, the higher the amplitude $U_S$ of the voltage ±$U_S$ generated by the voltage source 104. From equation 2 it follows that:

$$dM/dt=-u_i(N\cdot A\cdot\mu_0)=-(U_S-R_{SH}\cdot i_S)/(N\cdot A\cdot\mu_0). \qquad (5)$$

Thus, the higher the amplitude $U_S$ of the voltage ±$U_S$ generated by the voltage source 104, the higher the oscillation frequency of the secondary current. The oscillation frequency $f_{SENSOR}$ of the sensor can be derived from equation 2:

$$f_{SENSOR}=1/(\Delta t++\Delta t-), \qquad (6a)$$

wherein $$\Delta t+=(\mu_0\cdot\Delta M\cdot N\cdot A)/(U_S-i_S\cdot R_{SH}) \qquad (6b)$$

and $$\Delta t-=(\mu_0\cdot\Delta M\cdot N\cdot A)/(U_S+i_S\cdot R_{SH}). \qquad (6c)$$

$\Delta M$ designates a magnetization swing during a magnetization reversal. From the equations 6a to 6c it can be seen that the oscillation frequency $f_{SENSOR}$ of the sensor depends, on the one hand, on the primary current itself, as well as, on the other hand, on the voltage amplitude $U_S$ of the voltage generated by the voltage source 104 and on the magnetization swing $\Delta M$.

In particular with sensors employed for differential current measurement, the geometric arrangement of the primary conductor in relation to the core 103 is nonsymmetrical and the resulting magnetic field (i.e. the net magnetic field) is not entirely cancelled, also not when the difference $i_{Pa}-i_{Pb}$ equals zero. This leads to local saturations in the core 103, which amount to a reduction of the effective cross-section surface A of the core 103. The result of this is a modulation of the magnetization reversal times $\Delta t+$ and $\Delta t-$. This modulation is periodic and depends on the frequency $f_P$ of the primary current $i_P$. This effect can also be deduced from the equations 6b and 6c if one assumes that the (effective) cross-section surface A periodically varies together with the frequency $f_P$ of the primary currents $i_{Pa}$ and $i_{Pb}$.

An evaluation unit 602 serves to measure the frequency of the primary current by regularly sampling the secondary current $i_S$ or the measurement signal $U_{SH}$ representing the secondary current $i_S$ and calculating, from the sampling values $i_S[n]$, a spectrum, for example, by means of Fast Fourier Transformation (FFT), which may optionally include a windowing. The spectrum will indicate a significant (global) maximum for the oscillation frequency of the sensor $f_{SENSOR}$. Two further (local) maxima having distinctly lower values (side maxima) are found at the frequencies $f_1 = f_{SENSOR} - f_P$ and $f_2 = f_{SENSOR} + f_P$. The sought frequency $f_P$ of the primary current can thus be determined from the frequencies $f_1$ and $f_2$, for example, in accordance with equation 7:

$$f_P = (f_2 - f_1)/2 \tag{7}$$

Once the frequency $f_P$ is known, the amplitude $S(f_P)$ that corresponds to this frequency $f_P$, which, in turn, corresponds to the strength of the primary current $i_P$, can also be determined.

Figure 7:
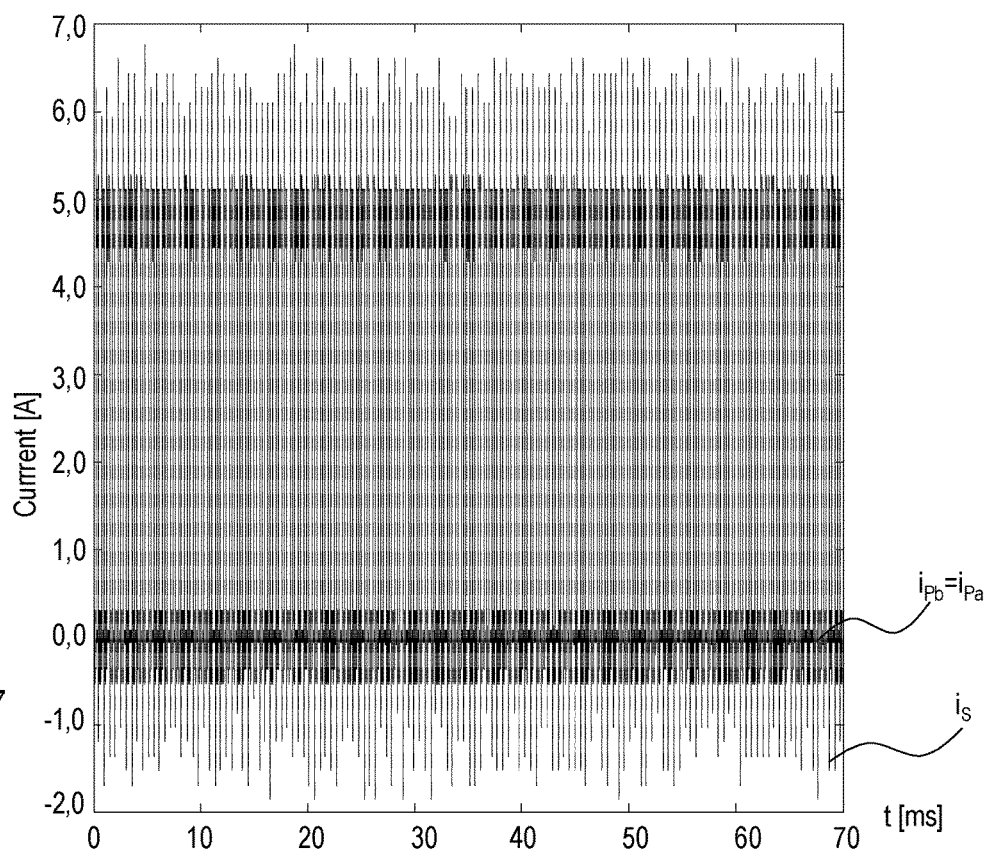
FIG. 7 shows, in a voltage-time diagram, the waveform over time of a secondary source voltage corresponding to the secondary current with a primary current of zero.
Figure 8:
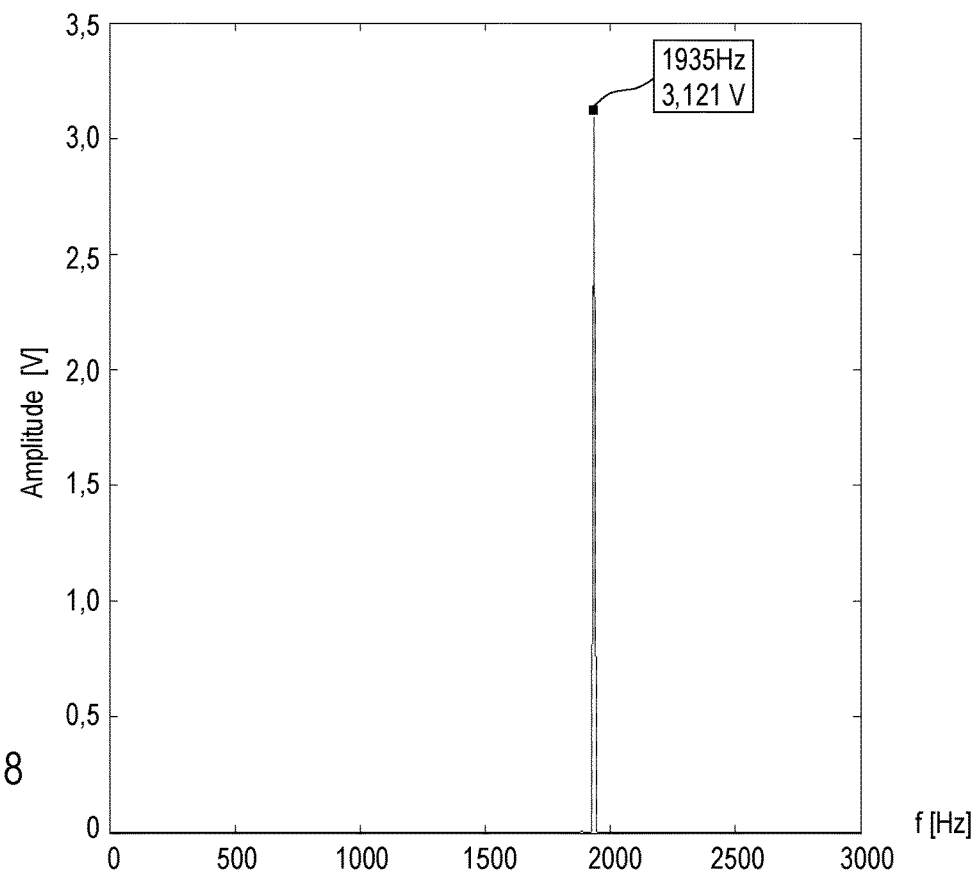
FIG. 8 shows, in a voltage-time diagram, the spectrum of the source voltage shown in FIG. 7.
Figure 9:
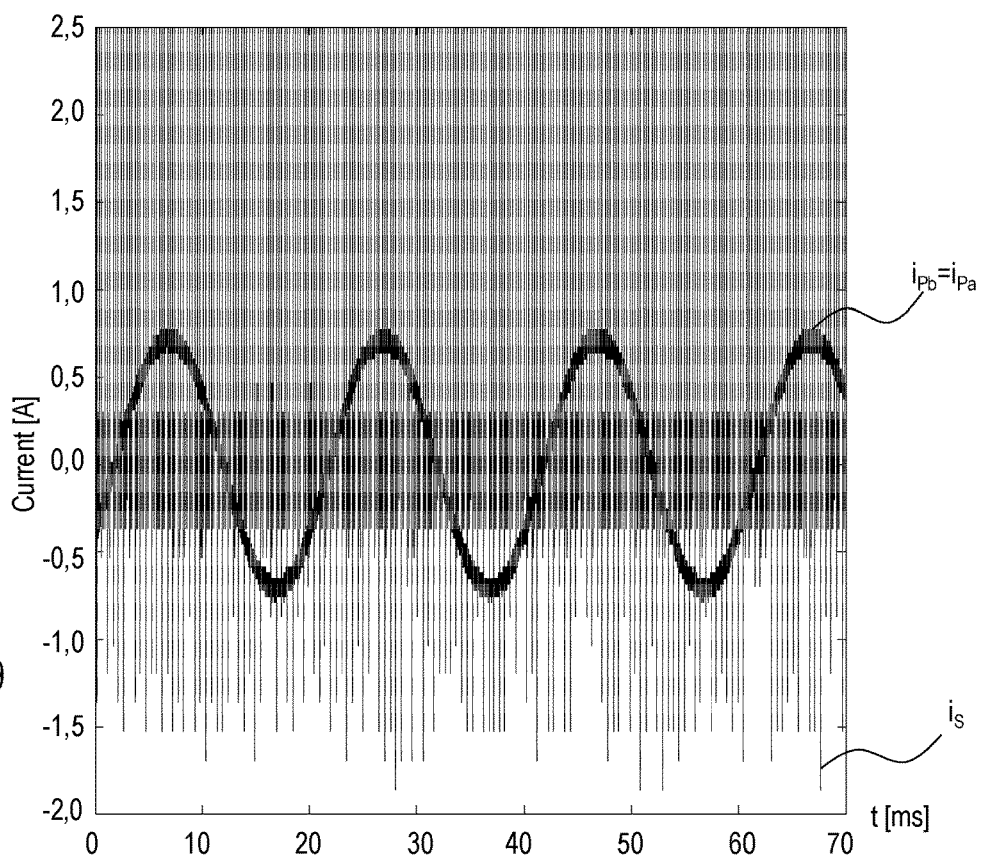
FIG. 9 shows, in a voltage-time diagram, the waveform over time of a secondary source voltage corresponding to the secondary current with a primary current of greater than zero and with a frequency of 50 Hz.
Figure 10:
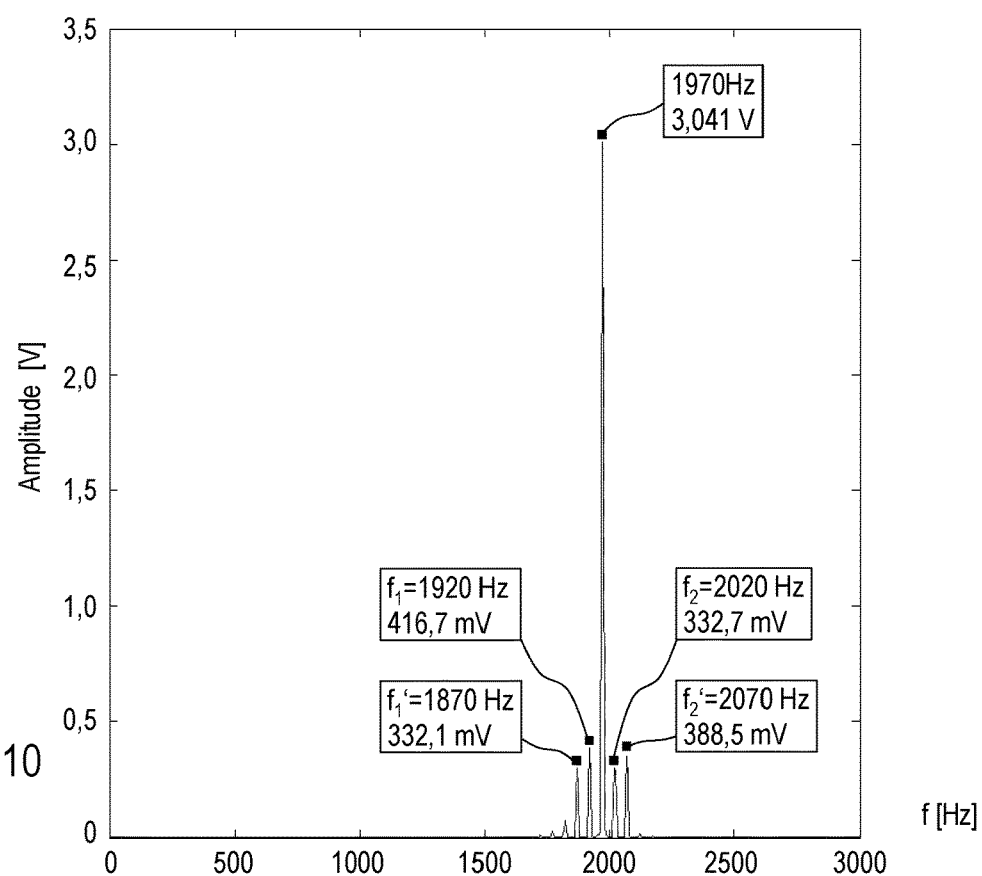
FIG. 10 shows, in a voltage-frequency diagram, the spectrum of the source voltage shown in FIG. 9 with a primary current of 5 A and 50 Hz.
Figure 11:
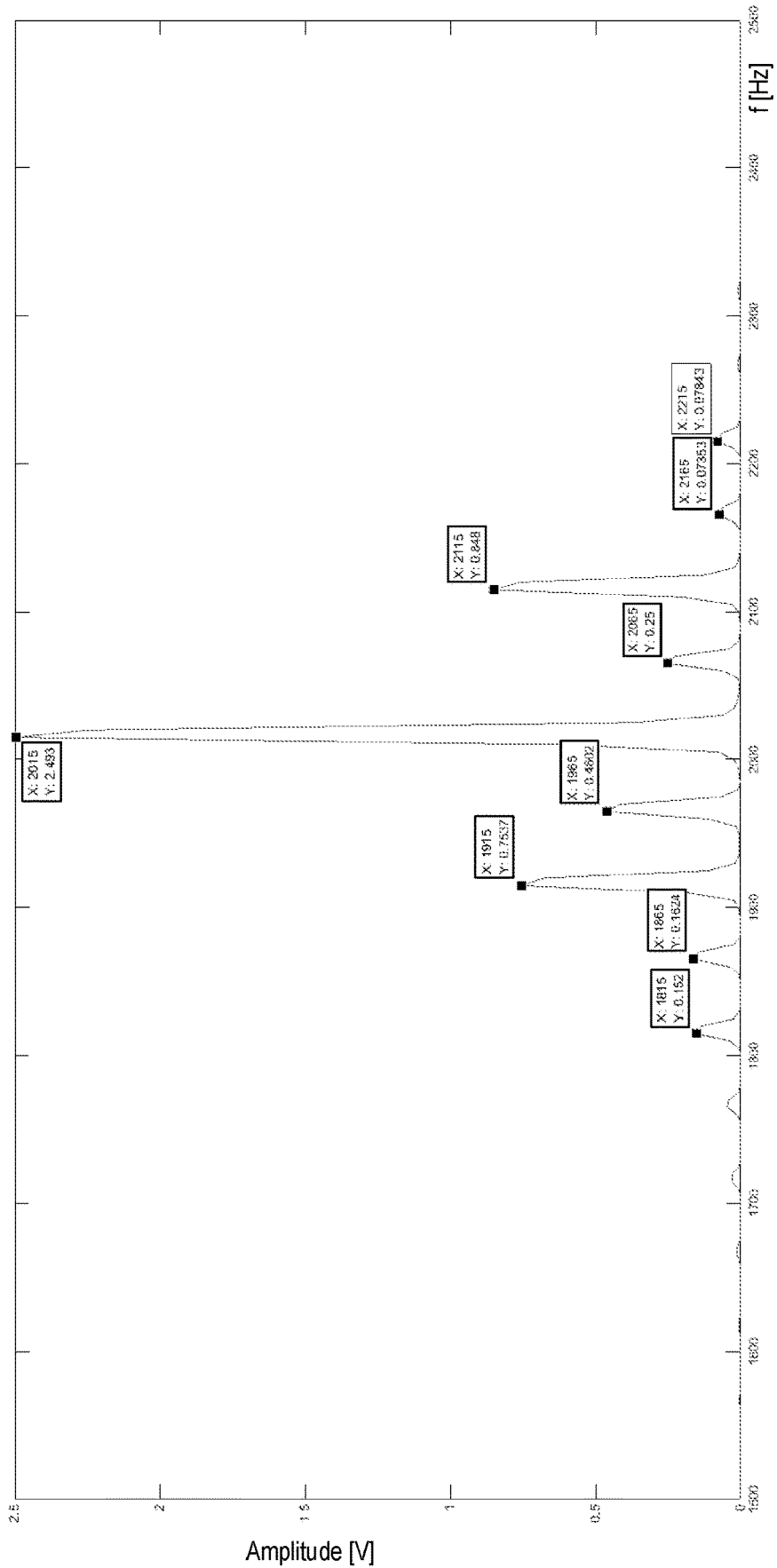
FIG. 11 shows, in a voltage-frequency diagram, the spectrum of a source voltage with a primary current of greater and zero and with a frequency of 10 A and 100 Hz.

The spectra shown in the FIGS. 8, 10 and 11 illustrate the functioning of the current sensor as described above. The FIGS. 7 and 9 show the waveform over time of the primary current $i_{Pa} = i_{Pb}$ of a sensor for differential current measurement (wherein $\Delta i_P = i_{Pa} - i_{Pb} = 0$), as well as of the corresponding secondary current $i_S$ over a time period of approximately 50 ms. In the case of FIG. 7 the primary current $i_{Pa} = i_{Pb}$ equals zero, as opposed to which, in the case of FIG. 9 the primary current $i_P$ exhibits a sinusoid curve at a current strength of 5 A and with a frequency $f_P$ of 50 Hz. In both cases the sensor measures the same differential current $i_{Pa} - i_{Pb}$, namely zero amperes. The lower diagrams of the FIGS. 6 and 7 each show the respective spectrum of the secondary current $i_S$ (depending on the primary currents $i_{Pa}$ and $i_{Pb}$). The global maximum of the spectrum lies at the oscillation frequency $f_{SENSOR}$ of the current sensor (cf. FIG. 3) which, in this case, is approximately 2 kHz. In the example illustrated with reference to the FIGS. 7 and 8 the oscillation frequency $f_{SENSOR}$ of the current sensor is 1935 Hz. In the case explained with reference to FIGS. 9 and 10 it is 1970 Hz. This slightly higher oscillation frequency value is attributable to the fact that the primary currents $i_{Pa}$ and $i_{Pb}$ cause local saturations in the core, thus reducing the effective cross-section surface of the core. As a consequence, the magnetization of the core can be more quickly reversed and the frequency rises. FIG. 11 shows the spectrum with a sinusoid primary current of 10 A and 100 Hz.

As long as the primary currents $i_{Pa}$ and $i_{Pb}$ contain no alternating current portion, the global maximum (main lobe) of the oscillation frequency $f_{SENSOR}$ of the current sensor will be the only significant maximum in the spectrum. A primary current $i_{Pa}$ and $i_{Pb}$ with a portion of alternating current, however, will result in the modulation of the period duration $f_{SENSOR}^{-1}$ (cf. equation 6a) of the sensor oscillation that was described earlier on. This modulation manifests itself in the spectrum as local maxima at the frequencies $f_1$ and $f_2$ (first side lobes), as well as f1' and f2' (second side lobes) on both sides of the global maximum of the frequency $f_{SENSOR}$. The distances of the frequencies of the two local maxima to the global maximum $|f_1 - f_{SENSOR}|$ and, respectively, $|f_2 - f_{SENSOR}|$ correspond to the frequency $f_P$ of the primary current $i_{Pa}$ and $i_{Pb}$. The frequency distance $f_2 - f_1$ corresponds to the twofold frequency $f_P$ of the primary current $i_{Pa}$ and $i_{Pb}$ (cf. equation 7). In the example shown in FIGS. 9 and 10, in which the frequency $f_P$ of the primary current is 50 Hz, the calculation in accordance with equation 7 results in a measured primary current frequency $f_{P'}$ of $(2020-1920)/2$ Hz=$100/2$ Hz=$50$ Hz. Alternatively or additionally, the second side lobes at the frequencies $f_{1'}$ and $f_{2'}$ can also be evaluated. The second side lobes are twice as far from the global maximum than the first side lobes at the oscillation frequency $f_{SENSOR}$ of the current sensor. Thus, it holds true that $f_{1'} = f_{SENSOR} - 2 \cdot f_P$ and $f_{2'} = f_{SENSOR} + 2 \cdot f_P$, as well as $f_1 - f_{1'} = f_P$ and $f_{2'} - f_2 = f_P$.

Current sensors for differential current measurement do not primarily provide any information regarding the strength of the individual primary current. In order to be able to measure, for example in multi-phase inverter circuits, the power being fed into the grid, additional components that measure the primary current in each individual conductor (phase) are needed to determine the total power output. For this, operating current sensors are generally used for each of the individual phases. With the current sensors described here, both the differential current, as well as the individual primary currents, can be directly measured.

For this, the location-dependent magnetic near field is determined and evaluated and from this the primary current and/or its frequency or zero crossings are calculated. Wherein with common current sensors the aim is to integrate, as good as possible, throughout a circulation $\oint H \cdot \delta_S$ around the primary conductor arrangement, here the modulation of the magnetic field H throughout this circulation is additionally used to obtain information about the primary current. For this, the current sensor that is configured for differential current measurement may be augmented, for example, with a local H field measurement, and/or the local increase of the magnetic field can be used to obtain information about the primary current.

In current sensors that operate according to the Flux Gate Principle (as explained above in connection with FIG. 1) a toroidal soft magnetic core of a, for example, highly permeable material is used to detect a magnetic field. For this, the core is driven cyclically from negative to positive saturation, during which it always runs through the entire hysteresis curve B(H). The design has a structure similar to that of a transformer, with a coil ratio of, for example, 1:N, wherein 1 is the number of primary windings and N represents the number of secondary windings. The current waveform in the magnetization periods is given, based on the aforementioned equations, in a simplified form by the following relationship:

$$i_S[n-1] = (i_P + H_C \cdot l_{FE})/N \tag{8}$$

$$i_S[n] = (i_P + H_C \cdot l_{FE})/N. \tag{9}$$

As previously explained, $i_S[n-1]$ is the secondary current during the first half period and $i_S[n]$ is the secondary current during the second half period. The following idealized relationships for the magnetization reversal times of the sensors can be deduced applying the Law of Induction $u_i = -N \cdot A(\Delta B/\Delta t)$ (cf. equations 6b and 6c above):

$$\Delta t+ = (\Delta B \cdot N \cdot A_{FE})/(U_S - i_S \cdot R_{SH}), \tag{10}$$

$$\Delta t- = (\Delta B \cdot N \cdot A_{FE})/(U_S + i_S \cdot R_{SH}), \tag{11}$$

wherein $A_{FE}$ is the effective ferrous cross-section of the core. If a constant voltage $U_S$ for magnetization reversal is assumed, it can be seen that a change in the magnetization reversal time results from a current flow in the primary conductor. With a current sensor with more than one primary conductors this leads to a near field effect (parasitic effect). Since, due to the conductor layout, it is impossible to completely compensate the current throughout the entire interior of the core, partial saturations arise in the concerned section of the core which lead to a reduction of the effective ferrous cross section $A_{FE}$. With an alternating current this results in a magnetization reversal time that is cyclically modulated with the frequency of the alternating current. With the aid of the frequency spectrum of the magnetization reversal, the frequency of the primary current and the amplitude at this frequency are determined, for example using FFT. The field strength that is proportional to the flowing primary current is then determined from the spectrum amplitude measured at the frequency of the primary current.

The magnetization of the core is always completely reversed, as a result of which, in absence of a primary current and thus of any differential current in the spectrum, only the fundamental frequency of the sensor is present (see FIG. 8). If, however, a temporally changing current, for example, a periodic current, is flowing in the primary conductor and being sent back and forth through the magnetic core, although no differential current will be generated by this, the magnetization voltage $u_i$ will nevertheless be changed in each half period of the primary current, providing both for a modulation of the carrier frequency with the primary frequency, as well as for an amplitude that is proportional to the primary current (see FIGS. 10 and 11). The spectrum of the primary current also changes together with its strength, from which the primary current may also be determined.

Figure 12:
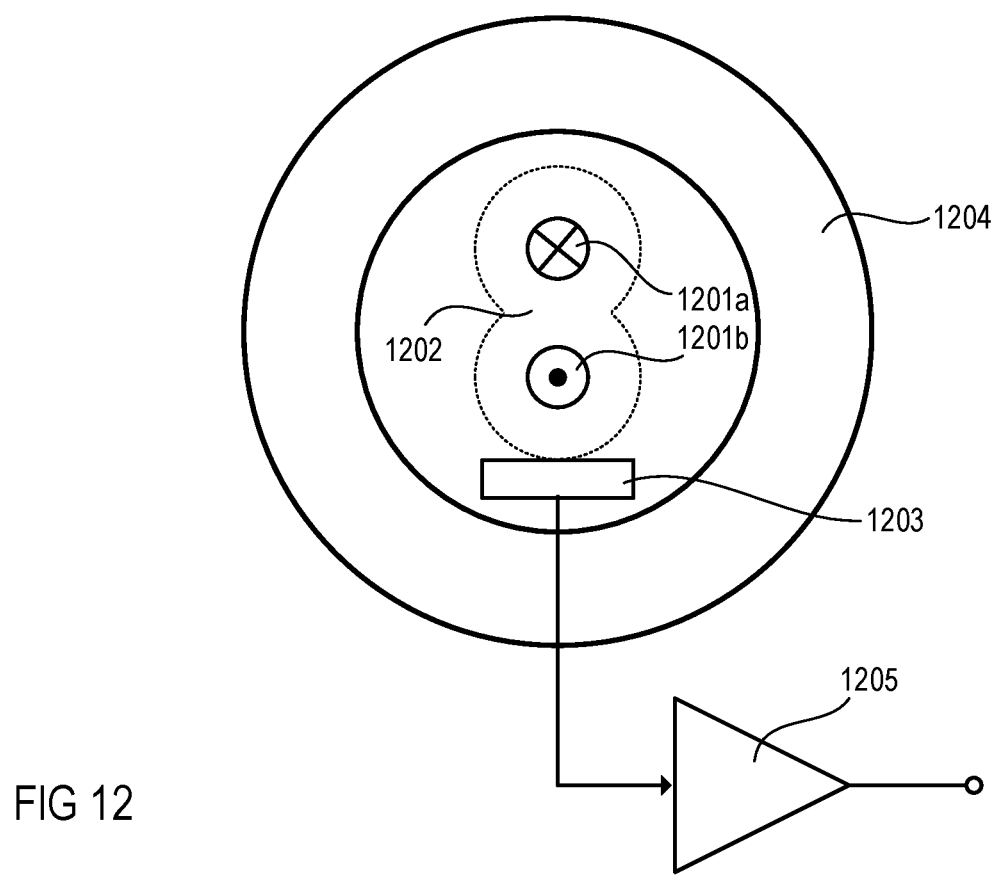
FIG. 12 shows, in a block diagram, an alternative arrangement for detecting the strength of the primary current.

As shown in FIG. 12, by arranging non-concentrically a primary conductor 1201 (1201a, 1201b) that is moved back and forth, an incompletely compensated near field 1202 is created around the primary conductor 1201. The near field 1202 can be measured with the aid of a probe 1203, such as a magnetic probe, or with a Hall element, from which the primary current in the primary conductor can then be determined using an evaluation unit 1205 such as an amplifier (similar as in the case of an open loop current sensor). If the differential current is determined with the aid of a toroidal magnetic core 1204, the probe 1203 and the primary conductor may be arranged inside the toroidal core 1204.

The invention claimed is:

1. A current sensor arrangement comprising:
   a first primary conductor configured to conduct a first primary current having a first current strength,
   a second primary current configured to conduct a second primary current having a second current strength,
   a magnetic core that encircles the first primary conductor and the second primary conductor such that the first primary current generates a first magnetic field component in the magnetic core, and the second primary current generates a second magnetic field component in the magnetic core, wherein the first magnetic field component and the second magnetic field component superpose to a total magnetic field, and
   an evaluation unit comprising a secondary conductor, at least one segment of which is encircled by the magnetic core, and a controllable voltage source that is connected to the secondary conductor and is configured to apply a voltage with controllable polarity to the secondary conductor, so that a corresponding secondary current flows through the secondary conductor;
   wherein the evaluation unit is configured to
   generate, based on the total magnetic field in the magnetic core, a signal representing the superposition of the first current strength and the second current strength,
   determine a spectrum of the secondary current, and
   determine, based on the spectrum, a measured value representing an amplitude of the first primary current.

2. The current sensor arrangement in accordance with claim 1, wherein the first primary current flows in the first primary conductor and the second primary current flows in the second primary conductor such that, in the magnetic core, the first magnetic field component is directed in the opposite direction of the second magnetic field component.

3. The current sensor arrangement in accordance with claim 2, wherein the first primary current and the second primary current have identical frequencies.

4. The current sensor arrangement in accordance with claim 1, wherein the evaluation unit comprises:
   a control unit, coupled to the secondary conductor and the controllable voltage source and configured to continuously detect the completion of a magnetic saturation in the core and, upon detecting the magnetic saturation of the core, to control the voltage source to reverse the polarity of the voltage in order to reverse the magnetization of the magnetic core, and
   a current evaluation unit that is configured to generate a measurement signal representing the secondary current, to determine the spectrum of the secondary signal based on the measurement signal, and to determine, from the spectrum of the secondary current, the frequency of the first primary current as well as the amplitude of the first primary current at the corresponding frequency.

5. The current sensor arrangement in accordance with claim 4, wherein the control unit is coupled to the current evaluation unit and is additionally configured to detect, by evaluating the measurement signal, that the magnetic saturation of the magnetic core has been reached, when the measurement signal exceeds a defined maximum value or falls below a defined minimum value.

6. The current sensor arrangement in accordance with claim 5, wherein the current evaluation unit is additionally configured to
   determine the time span during which the measurement signal exceeds the defined maximum value and generate a positive signal corresponding to this time span;
   determine the time span during which the measurement signal falls below the defined minimum value and generate a negative signal corresponding to this time span, and
   compare the positive signal and the negative signal with each other.

7. The current sensor arrangement in accordance with claim 4, wherein the current evaluation unit is configured to periodically sample the measurement signal and to calculate from the sampled values by means of spectral transformation a digital spectrum of the measurement signal to obtain the spectrum of the secondary current.

8. The current sensor arrangement in accordance with claim 1,
   wherein the secondary current has an oscillation frequency, and wherein the spectrum of the secondary current has a main lobe at the oscillation frequency of the secondary current and two side lobes symmetrical to the main lobe, and wherein the frequency of the primary current is determined from the distance between the main and side lobes or from the distance between the two side lobes.

9. The current sensor arrangement in accordance with claim 8, wherein the distance between main lobe and one of the neighboring side lobes corresponds to the frequency of the primary current.

10. The current sensor arrangement in accordance with claim 1, wherein the magnetic field evaluation unit has at least one magnetic field probe and is configured to determine, by means of the at least one magnetic field probe, a near field of the first primary conductor and/or a near field of the second primary conductor or the near fields of both primary conductors and to determine therefrom the first primary current or the second primary current or both.

11. The current sensor arrangement in accordance with claim 1, wherein the spectrum is composed of a main lobe and a plurality of side lobes; and wherein, to determine, based on the spectrum, the measured value representing the amplitude of the first primary current, the evaluation unit is configured to determine the amplitude of the first primary current based on the amplitude of at least one of the side lobes of the spectrum.

12. A method for contactless current measurement at a first primary conductor and a second primary conductor, the first primary conductor being configured to conduct a first primary current having a first current strength, and the second primary conductor being configured to conduct a second primary current having a second current strength, a magnetic core encircling the first primary conductor and the second primary conductor such that the first primary current generates a first magnetic field component and the second primary current generates a second magnetic field component and the first magnetic field component and the second magnetic field component superpose to a total magnetic field, the method comprising:

applying a voltage with controllable polarity to a secondary conductor, at least one segment of which is encircled by the magnetic core so that a corresponding secondary current flows through the secondary conductor;

detecting the total magnetic field in the magnetic core based on the secondary current and generating from the total magnetic field detected in the magnetic core a signal corresponding to the superposition of the first current strength and the second current strength, determining a spectrum of the secondary current; and determining, based on the spectrum, a measured value representing an amplitude of the first primary current.

13. The method in accordance with claim 12, wherein the first primary current flows in the first primary conductor and the second primary current flows in the second primary conductor such that, in the magnetic core, the first magnetic field component is directed in the direction opposite of the second magnetic field component.

14. The method in accordance with claim 13, wherein the first primary current and the second primary current have identical frequencies.

15. The method in accordance with claim 12, further comprising:

continuously detecting when a magnetic saturation of the core is reached and, upon detection of the magnetic saturation of the core, reversing the polarity of the voltage in order to reverse magnetize the magnetic core, generating a measurement signal representing the secondary current, and determining the spectrum of the secondary signal based on the measurement signal, determining the frequency of the first primary current based on the spectrum, and determining the amplitude of the first primary current at the corresponding frequency based on the spectrum.

16. The method in accordance with claim 15, further comprising:

detecting when a magnetic saturation of the magnetic core is reached by evaluating when the measurement signal exceeds a defined maximum value or falls below a defined minimum value.

17. The method in accordance with claim 16, further comprising:

determining the time span during which the measurement signal exceeds the defined maximum value and generating a positive signal corresponding to this time span, and determining the time span during which the measurement signal falls below a defined minimum value and generating a negative signal corresponding to this time span, and comparing the positive signal with the negative signal.

18. The method in accordance with claim 15, wherein the measurement signal is periodically sampled and a digital spectrum of the measurement signal is calculated from the sampling values by means of spectral transformation.

19. The method in accordance with claim 12, wherein the secondary current has an oscillation frequency, wherein the spectrum has a main lobe at the oscillation frequency of the secondary current and two side lobes symmetrical to the main lobe, and wherein the frequency of the primary current is determined from the distance between main and side lobes or from the distance between the two side lobes.

20. The method in accordance with claim 19, wherein the distance between main lobe and one of the neighboring side lobes corresponds to the frequency of the primary current.

21. The method in accordance with claim 12, wherein a near field of the first primary conductor and/or a near field of the second primary conductor or the near fields of both primary conductors is/are determined and from this the first primary current or the second primary current or both is/are determined.

* * * * *